(12) United States Patent
Reisker et al.

(10) Patent No.: US 6,831,460 B2
(45) Date of Patent: Dec. 14, 2004

(54) COIL STRUCTURE WITH TAPERED CONDUCTIVE MEMBERS FOR IMPROVED HOMOGENEITY IN MRI

(76) Inventors: Theodore J. Reisker, 2497 Dogwood Dr., Wexford, PA (US) 15090; William J. Monski, 1486 Grandview Way, Sewickley, PA (US) 15143; Eric D. Reid, 612 Nelson Rd., Farmington, PA (US) 15437; George J. Misic, 1936 Duncan Ave., Allison Park, PA (US) 15101

( * ) Notice: Subject to any disclaimer, the term of this patent is extended or adjusted under 35 U.S.C. 154(b) by 0 days.

(21) Appl. No.: 10/068,300

(22) Filed: Feb. 5, 2002

(65) Prior Publication Data

US 2003/0071622 A1 Apr. 17, 2003

Related U.S. Application Data

(63) Continuation of application No. 09/449,256, filed on Nov. 24, 1999, now Pat. No. 6,344,745.
(60) Provisional application No. 60/109,831, filed on Nov. 25, 1998.

(51) Int. Cl.$^7$ ................................................ G01V 3/00
(52) U.S. Cl. ...................................... 324/318; 324/322
(58) Field of Search ........................ 324/318, 320–322, 324/309, 307, 306, 300; 400/421

(56) References Cited

U.S. PATENT DOCUMENTS

| | | | |
|---|---|---|---|
| 4,634,980 A | 1/1987 | Misic et al. | 328/318 |
| 4,684,895 A | 8/1987 | Misic et al. | 328/322 |
| 4,692,705 A | 9/1987 | Hayes | 328/318 |
| 4,731,584 A | 3/1988 | Misic et al. | 328/318 |
| 4,740,751 A | 4/1988 | Misic et al. | 328/318 |
| 4,764,726 A | 8/1988 | Misic et al. | 328/360 |
| 4,793,356 A | 12/1988 | Misic et al. | 328/318 |
| 4,797,617 A | 1/1989 | Misic et al. | 328/318 |
| 4,825,162 A | 4/1989 | Roemer et al. | 328/318 |
| 4,839,594 A | 6/1989 | Misic et al. | 328/318 |
| 4,841,248 A | 6/1989 | Mehdizadeh et al. | 600/410 |
| 4,879,516 A | 11/1989 | Mehdizadeh et al. | 328/318 |
| 4,881,034 A | 11/1989 | Kaufman et al. | 600/410 |
| 4,920,318 A | 4/1990 | Misic et al. | 600/410 |
| 4,975,644 A | 12/1990 | Fox | 328/318 |
| 5,136,244 A | 8/1992 | Jones et al. | 328/318 |
| 5,196,796 A | 3/1993 | Misic et al. | 328/309 |
| 5,209,233 A | 5/1993 | Holland et al. | 328/322 |
| 5,256,971 A | 10/1993 | Boskamp | 328/318 |
| 5,258,717 A | 11/1993 | Misic et al. | 328/318 |
| 5,315,251 A | 5/1994 | Derby | 328/309 |
| 5,348,010 A | 9/1994 | Schnall et al. | 328/318 |
| 5,355,087 A | 10/1994 | Claiborne et al. | 328/318 |
| 5,517,120 A | 5/1996 | Misic et al. | 328/318 |
| 5,521,506 A | 5/1996 | Misic et al. | 328/318 |
| 5,602,479 A | 2/1997 | Srinivasan et al. | 328/309 |
| 5,610,520 A | 3/1997 | Misic | 328/307 |
| 5,998,999 A | 12/1999 | Richard et al. | 328/318 |
| 6,040,697 A | 3/2000 | Misic | 328/309 |
| 6,051,974 A | 4/2000 | Reisker et al. | 324/318 |
| 6,100,691 A | 8/2000 | Yeung | 328/318 |
| 6,177,797 B1 | 1/2001 | Srinivasan | 600/410 |
| 6,223,065 B1 | 4/2001 | Misic et al. | 328/318 |

OTHER PUBLICATIONS

Roemer et al., *Magnetic Resonance in Medicine*, "The NMR Phased Array," vol. 16, pp. 192–225 (1990).

Adriany, G. et al., "A Transmit/Receive Quadrature Birdcage Array Coil for 4 Tesla," Proceddings of the International Society for Magnetic Resonance in Medicine, Fifth Scientific Meeting and Exhibition, vol. 1, p. 177 (Apr. 12–18, 1997).

*Primary Examiner*—Brij B. Shrivastav
(74) *Attorney, Agent, or Firm*—Gregory L. Bradley; James R. Stevenson

(57) ABSTRACT

A coil for creating improved homogeneity in magnetic flux density in a radio frequency resonator for magnetic resonance imaging and spectroscopy of the human head. The coil has a plurality of conductive members. Each of the conductive members has a linear portion and a tapered portion. The conductive members are arranged to form a first opening having a first diameter and a second opening having a second diameter, with the second diameter being different from the first diameter. The tapered portions of the conductive members provide the coil with a substantially homogeneous pattern of magnetic flux density in at least one of three orthogonal imaging planes of the coil.

51 Claims, 13 Drawing Sheets

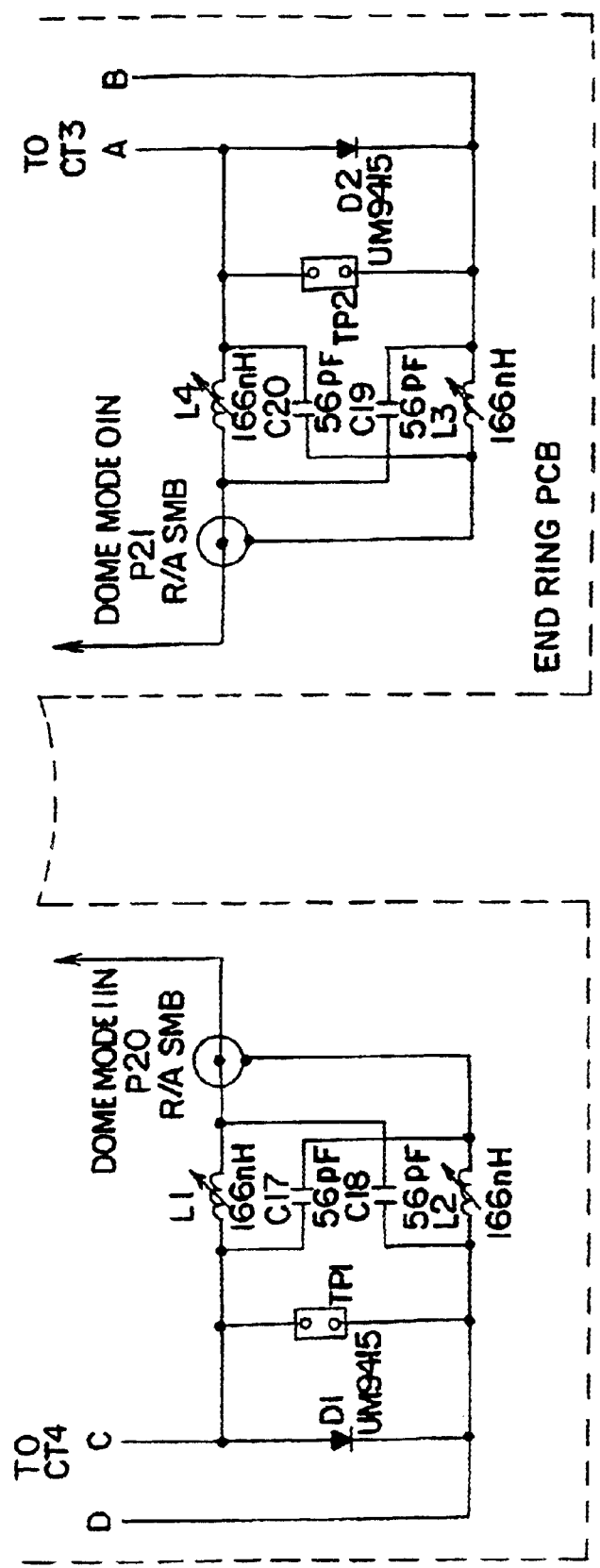
FIG. 1B(1)

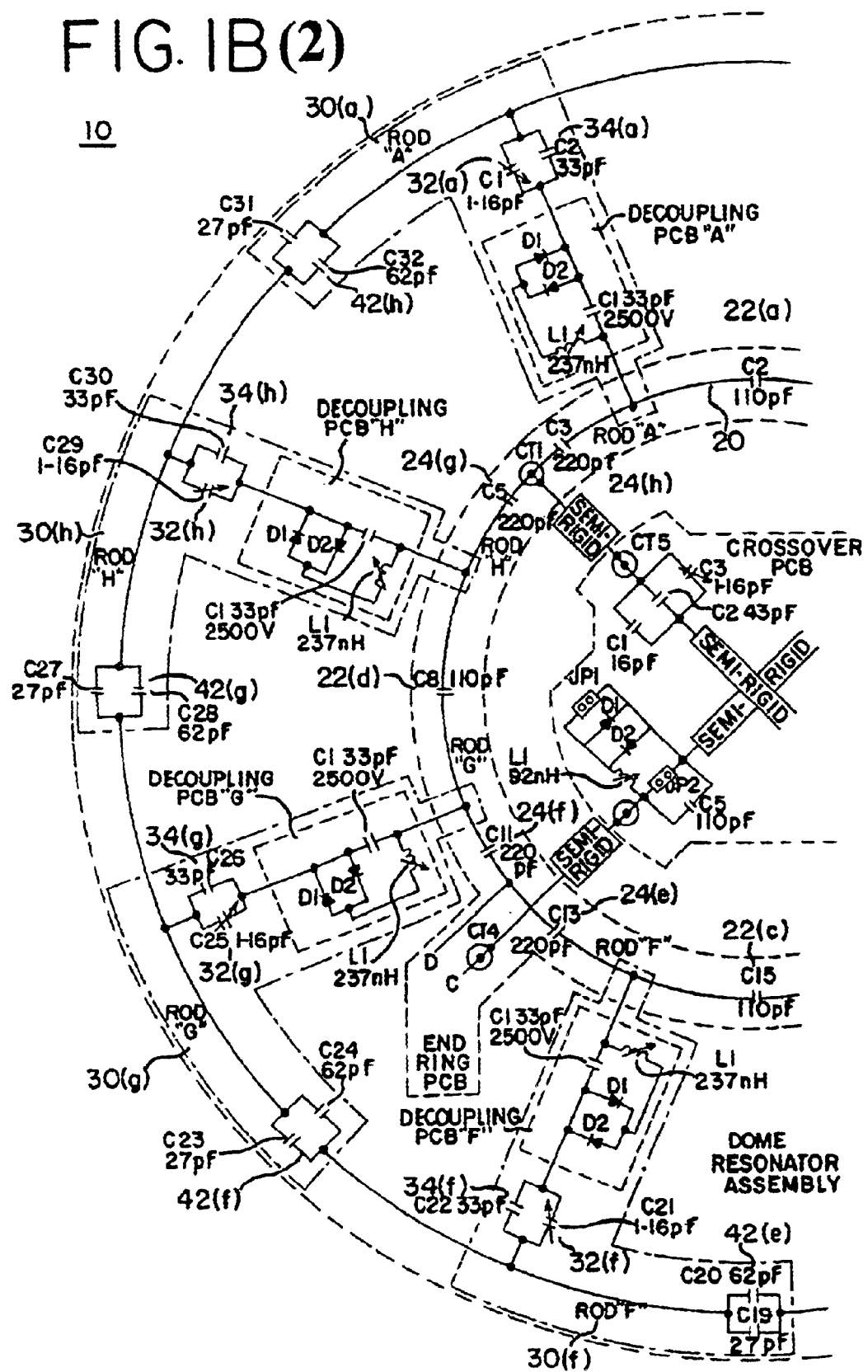
FIG. IB(2)

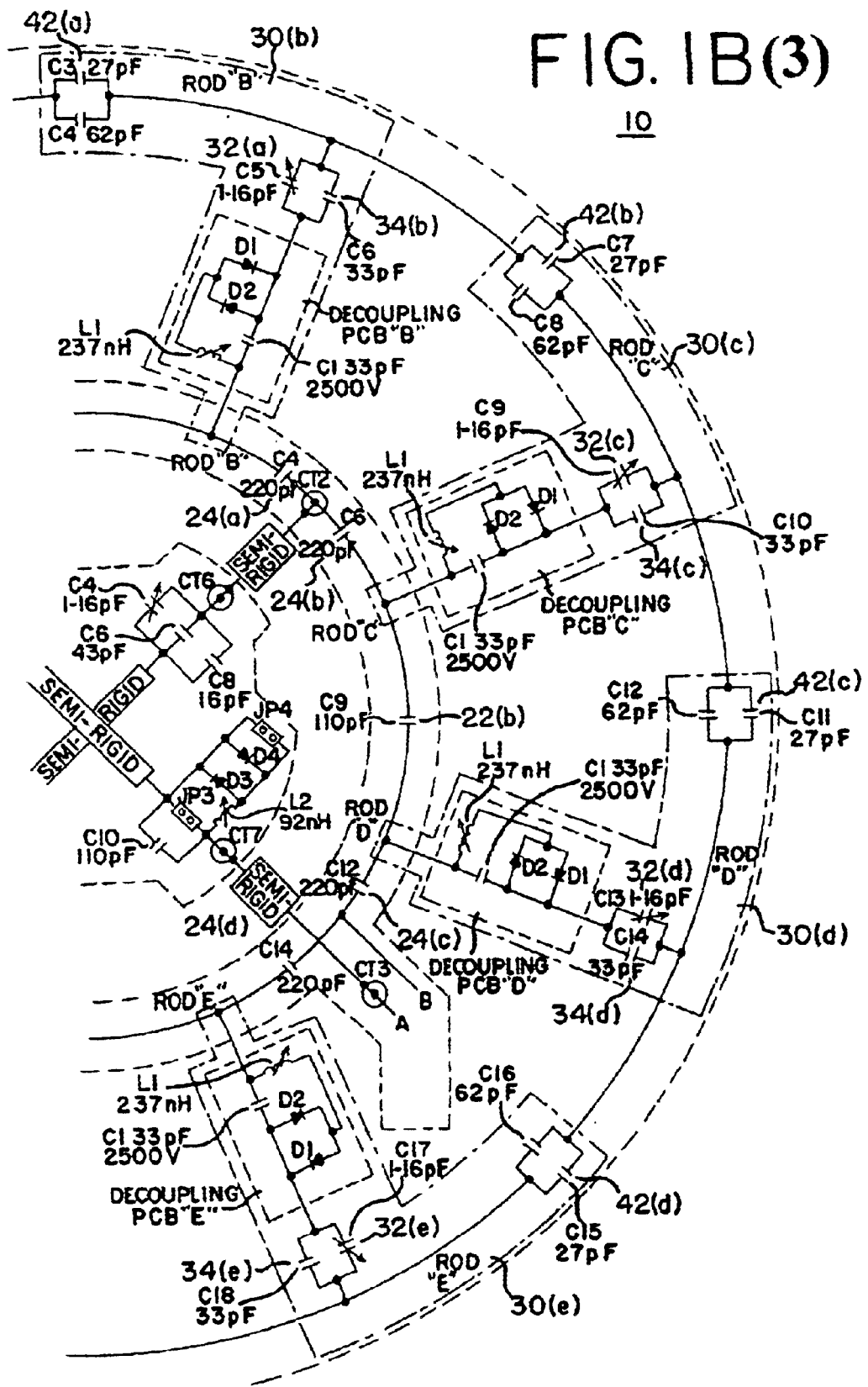
FIG. 1B(3)

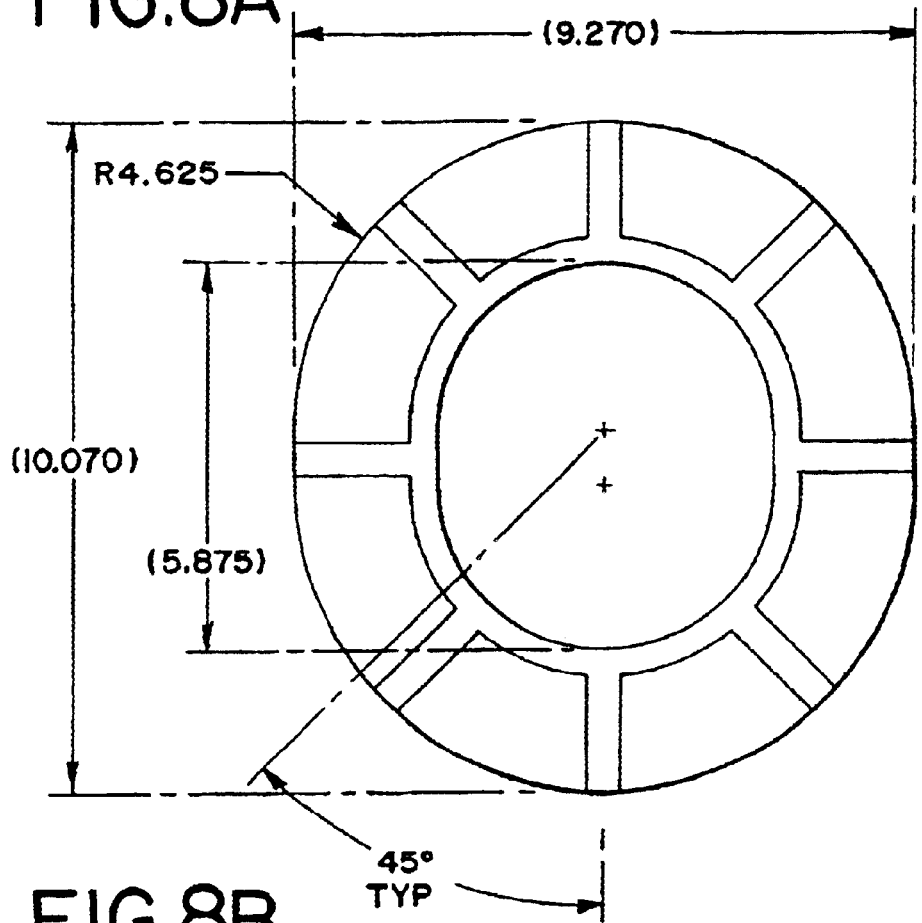
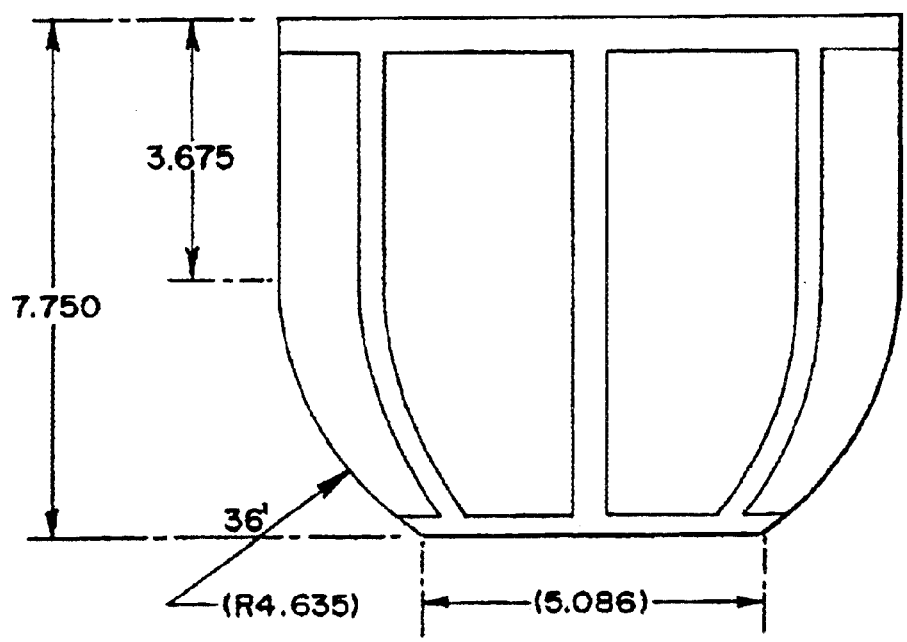

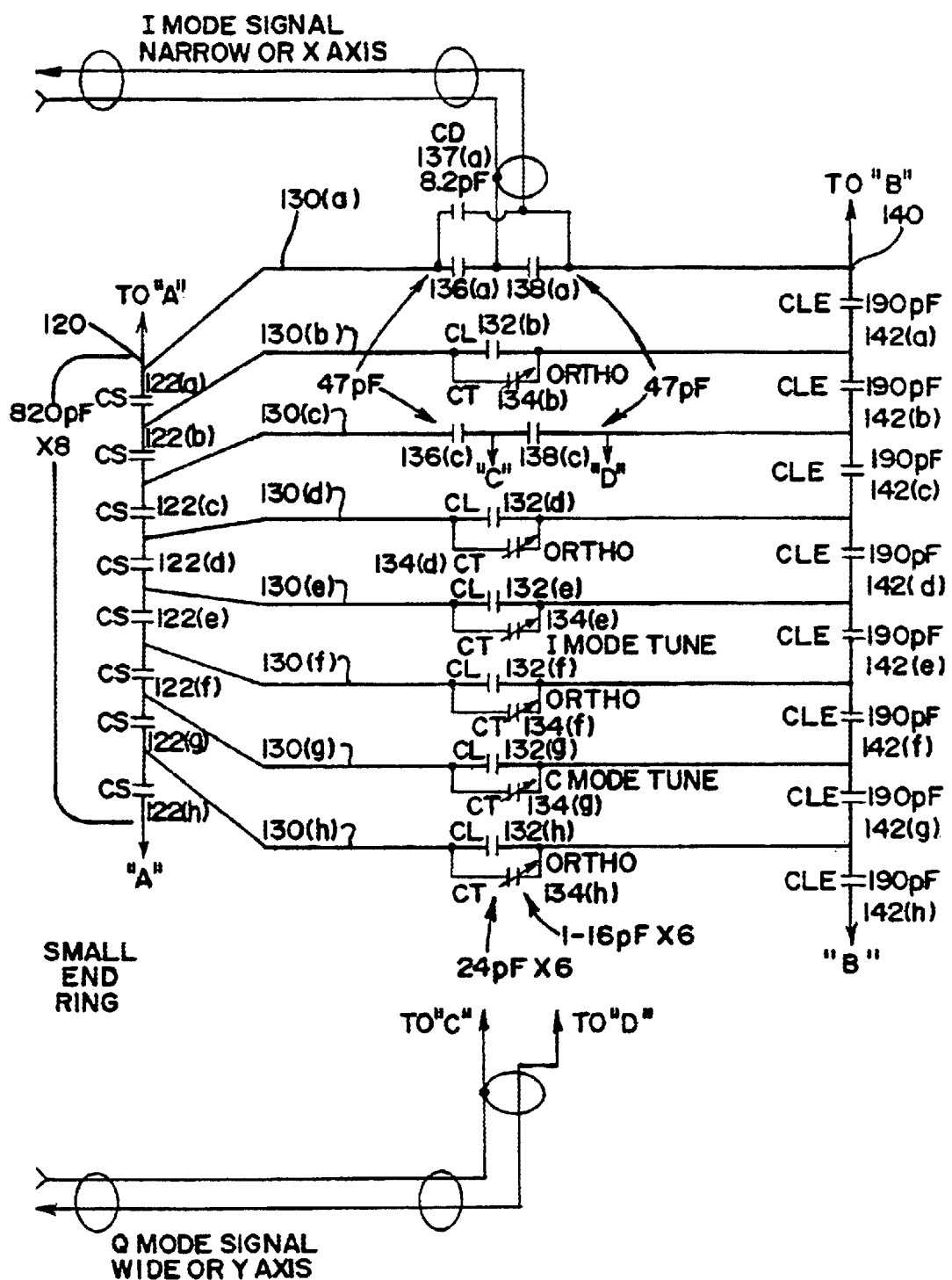

COIL STRUCTURE WITH TAPERED CONDUCTIVE MEMBERS FOR IMPROVED HOMOGENEITY IN MRI

CROSS-REFERENCE TO RELATED APPLICATIONS

The invention disclosed in this document is a continuation of application for patent: TAPERED BIRDCAGE RESONATOR FOR IMPROVED HOMOGENEITY IN MRI, U.S. application Ser. No. 09/449,256, filed Nov. 24, 1999, which issued as U.S. Pat. No. 6,344,745 on Feb. 5, 2002. The present application, and the above-identified application on which it is based, claims the benefit of U.S. Provisional Application No. 60/109,831, filed Nov. 25, 1998.

FIELD OF THE INVENTION

This invention relates to a radio frequency resonator coil suitable for magnetic resonance imaging. The radio frequency resonator coil is a well known device that is useful for imaging regions of a human patient, such as the head and neck. Other useful applications for this invention include imaging other portions of the human anatomy or for imaging non-human subjects.

BACKGROUND OF THE INVENTION

Magnetic resonance imaging (MRI) is an imaging technique that may be used to produce high resolution images of the interior of the human body, for example, for the purpose of medical diagnosis. Interior images of the human body are produced based on the absorption and emission of energy in the radio frequency range of the electromagnetic spectrum. The emission of energy is then correlated to the attenuation spectrum of the various tissues in the human body.

Typically, magnetic resonance imaging is performed by placing a patient in a constant magnetic field, $B_0$. A radio frequency excitation pulse may then be transmitted to the examined region. The excitation pulses cause magnetic moment alignment of atomic nuclei. Upon removal of the excitation pulses, the nuclear moments begin to realign with the constant magnetic field, $B_0$. During this realignment period, the nuclear moments emit radio frequency signals characteristic of the magnetic field and of the particular chemical environment in which the nuclei exist.

An RF coil may be used to both transmit the excitation pulses and receive the signals from the nuclei. Alternatively, one RF coil may be used to transmit the excitation pulses and another separate coil to receive the signals from the nuclei. RF coils of various types are known.

For purposes of the following, coordinate references (X, Y and Z) are sometimes discussed. As used herein, the Z-axis is oriented along the main magnetic field, $B_0$. When reference is made to homogeneity, it is in reference to the homogeneity of the field pattern along the Z-axis, at any point in the directions of the Y and X axes.

One type of RF coil, the birdcage resonator coil, is known for its homogeneity in the XY image plane, as well as its high signal-to-noise ratio performance. Such devices, however, may still exhibit shortcomings. For example, in the XZ and YZ image planes, the field pattern is not as homogeneous as it may be in the XY image plane. Homogeneity in the XZ and YZ image planes is desirable for high resolution imaging. Increased homogeneity in the YZ or XZ image planes of the conventional birdcage coils may be achieved by extending the length of the coil. This increases the volume of the coil, however, and therefore reduces the signal-to-noise performance of the coil.

U.S. Pat. No 5,602,479 to Srinivasan et al. ("the Srinivasan patent"), the contents of which are incorporated herein by reference, describes a birdcage coil where the z-axis conductors converge to a single point at the superior end of the coil. Birdcage coils having this characteristic—the convergence of the z-axis conductors to a single point—may be referred to herein as "dome resonators." Srinivasan further shows combinations of conductors using overlapped resonators, where the conductor junction points of all the z-axis conductors of the dome resonator are merged to a common point at one end which forms a virtual ground point.

A disadvantage of the devices shown in the Srinivasan patent is that the convergence of the junction points to form a virtual ground forces the resonator magnetic flux density to be highest at the convergent dome end, and fall off non-homogeneously as a function of distance from the dome end. The Srinivasan patent also discusses methods of distributing currents in a dome resonator between first and second rings or changing the convergence angle to influence homogeneity. The disadvantages of these methods, however, are that they require careful component selection to distribute the currents appropriately, they result in a coil that is too long for optimum signal-to-noise ratio, and they require a virtual ground convergence point.

An article entitled "A 3×3 Mesh Two Dimensional Ladder Network Resonator for MRI of the Human Head," Meyer et. al., Journal of Magnetic Resonance, Series B 107, 19–24 (1995), the contents of which are incorporated herein by reference, demonstrates that the resonant modes of the planar coil pairs are degenerate modes, and provides a saddle pair coil configuration at the non-domed end of the resonator, and a coplanar loop configuration at the domed end. Disadvantages of such an arrangement may include non-optimized homogeneity, and reduced signal-to-noise performance compared to devices made in accordance with the present invention.

An article entitled "A Novel Multi-segment Surface Coil for Neuro-Functional Magnetic Resonance Imaging," Lin et. al., Magnetic Resonance in Medicine, 39: 164–168 (1998), the contents of which are incorporated herein by reference, demonstrates the resonant modes of the planar coil pairs are degenerate modes, as two orthogonal half-loop modes and causes the magnetic flux density to be most concentrated at the closed superior end or apex end of the resonator, thereby producing strong inhomogeneity. The device described by Lin et al. also requires closed end convergence at the most superior end of the conductors for the resonance modes to operate.

It is desirable to have improved homogeneity and, simultaneously, high signal-to-noise ratio performance, particularly in the XZ and YZ image planes, over that provided by known coils and methods. It is also desirable to improve homogeneity without impairing the signal-to-noise performance of a birdcage coil. It would therefore be desirable to have an improved birdcage coil.

SUMMARY OF THE INVENTION

This invention describes a novel apparatus and method for improving the XZ and YZ inhomogeneity of birdcage coils, without effecting the length of the coils.

The most homogeneous section of a conventional birdcage coil is within the center third of the length of the structure. Therefore to achieve maximum homogeneity within this region, a length to diameter ratio of two to one is typically used. The point of diminishing return for homogeneity has empirically been shown to be when the length-to-diameter ratio reaches two-to-one. To achieve maximum signal-to-noise ratio performance for human head imaging, however, the ratio of the length-to-diameter is approximately one to one. Therefore, prior to the present invention, conventional birdcage coils could not simultaneously provide maximum signal-to-noise performance for human head imaging while achieving maximum homogeneity, especially over the region of the brain, because of the conflicting physical restraints placed on the coil by these two requirements.

A preferred embodiment of the present invention meets the need for an MRI coil that provides the high signal-to-noise ratio performance found in a normal length resonator coil combined with the homogeneity of a long resonator coil. In particular, improved homogeneity is achieved without increasing the length of the coil, thereby maintaining a high signal-to-noise ratio. Moreover, the preferred embodiments of the present invention meet the requirement of improved XZ and YZ image plane homogeneity for shorter, higher signal-to-noise ratio, birdcage coils by tapering the coil to optimize the magnetic field homogeneity. This technique may provide an improved signal-to-noise ratio over even a short birdcage coil of conventional design, especially in the region of the brain.

In accordance with a first aspect of the present invention, a method is provided for increasing homogeneity in the magnetic field without increasing the length to diameter ratio of the coil. The method provides a coil with superior signal-to-noise performance and increased homogeneity in the XZ and YZ image planes.

In accordance with a second aspect of the present invention, a tapered birdcage coil is provided. The coil structure includes critically tapering the most superior end of the coil, and varying the radius of the taper and the end ring diameter, until the maximum homogeneity is realized in the field pattern of the coil.

In accordance with a third aspect of the present invention, a tapered birdcage coil is provided. The coil structure includes critically tapering both the superior end of the coil and the inferior end of the coil, and varying the radius of the taper and the end ring diameters, until the maximum homogeneity is realized in the field pattern of the coil. The tapered birdcage coil provides improved homogeneity and good signal-to-noise ratio performance.

It is an objective of the present invention to provide the homogeneity of a longer birdcage coil, with the signal-to-noise characteristic of a shorter birdcage coil.

BRIEF DESCRIPTION OF THE DRAWINGS

The preferred embodiments of the present invention are illustrated by way of example, and not limitation, in the figures of the accompanying drawings, in which:

FIGS. 1B(1), 1B(2) and 1B(3) illustrate an electrical schematic of an embodiment for a receive-only tapered birdcage resonator;

FIGS. 8A and 8B illustrate an alternative embodiment of a high resolution tapered brain coil having an elliptical shape where the length of the coil is less than the large diameter of the large end ring and the legs are radially tapered; and FIG. 9 is an electrical schematic for the alternative embodiment of the tapered resonator shown in FIGS. 8A and 8B.

DETAILED DESCRIPTION OF THE
PRESENTLY PREFERRED EMBODIMENT(S)
OF THE INVENTION

Figure 2A:
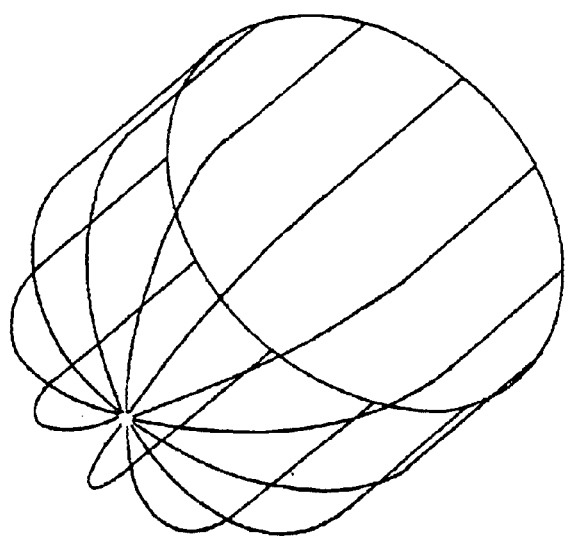
FIG. 2A depicts a wire model for a prior art birdcage resonator, were the wire model may be used in a Biot-Savart software analysis program, in which the conductor geometry pattern represents the case of a dome resonator, where the conductors at most superior end of the coil converge to a common point.

The presently preferred embodiments of the present invention will now be described with reference to the Figures in which like elements are referred to by like numerals. FIG. 2A depicts a wire model for a prior art birdcage resonator in which the conductor geometry pattern represents the case of a dome resonator. Dome resonators are characterized by the convergence of the z-axis conductors to a single point. As shown in FIG. 2A, the z-axis conductors converge at the most superior end of the coil to a common point 5. A disadvantage of resonators characterized by this wire model is that the convergence of the junction point forms a virtual ground, thus forcing the resonator magnetic flux density to be highest at the convergent dome end, and to fall off non-homogeneously as a function of distance from the dome end.

Figure 3:
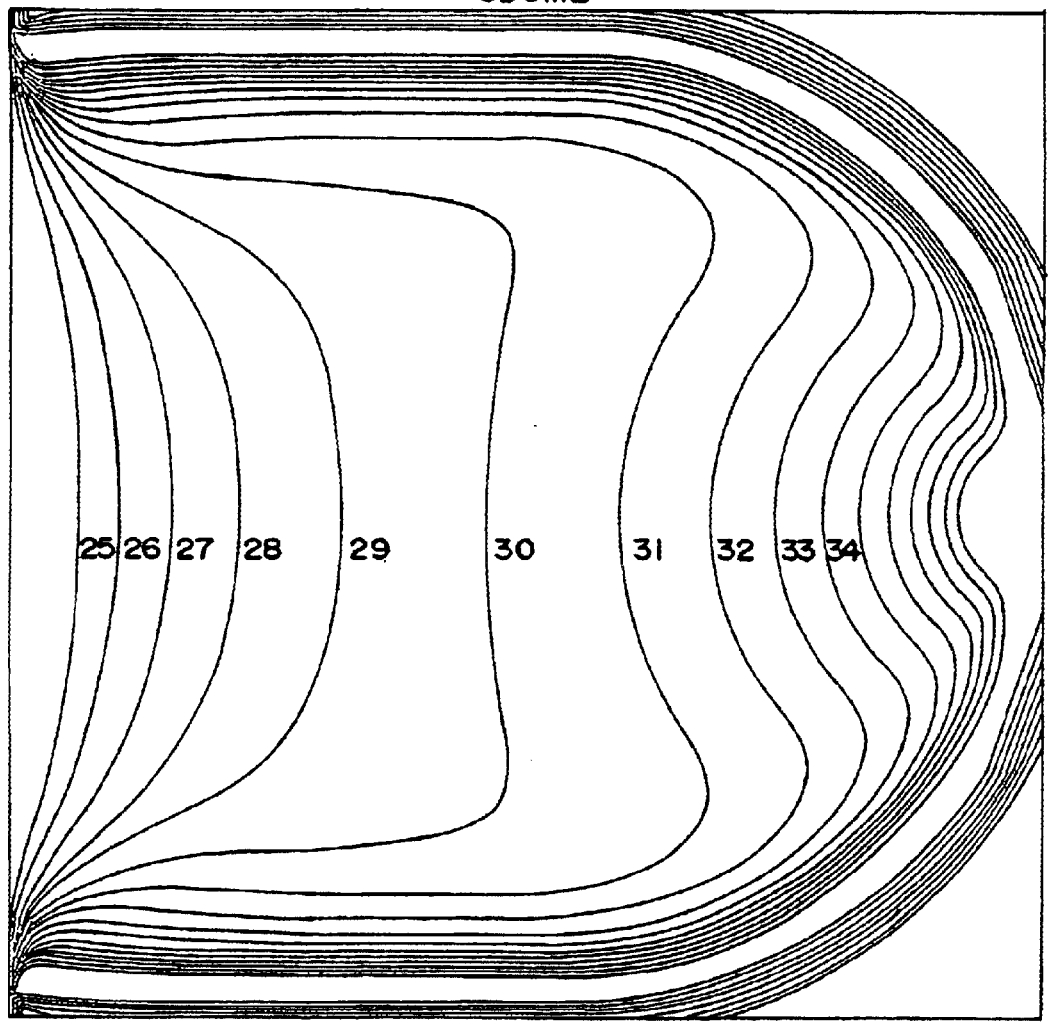
FIG. 3 illustrates a cross sectional plot of the iso-intensity lines of the magnetic flux density (dB) as a function of position with respect to the conductor geometry pattern for the case of a dome resonator as shown in FIG. 2A.

The magnetic flux density at points within the dome resonator wire model shown in FIG. 2A may be studied using a Biot-Savart software analysis program, as is known to those skilled in the art. If the birdcage coil is driven in quadrature, then the magnetic flux density plots in the XZ and YZ planes should be identical because the field pattern of the coil has radial symmetry about the Z-axis. FIG. 3 illustrates a cross sectional plot of iso-intensity lines of the magnetic flux density (dB) as a function of position with respect to the conductor geometry pattern for the case of a dome resonator as shown in FIG. 2A. The plot shown in FIG. 3 may be generated by applying Biot-Savart's Law to the dome resonator wire model shown in FIG. 2A.

As illustrated in FIG. 3, the iso-intensity lines are well spaced over the middle third of the length of the dome resonator, but become closely spaced at both ends; the dome end creates a field that is too high in relative intensity, and the inferior end creates a field that drops off in relative intensity. If the domed resonator were to be used for studies of the head, for example, it would be desirable to improve the homogeneity, especially in the region toward the superior end of the resonator.

Figure 2B:
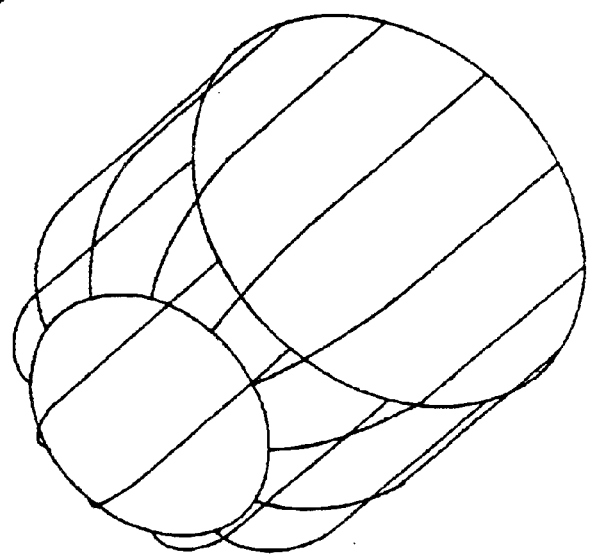
FIG. 2B depicts a wire model of a tapered birdcage resonator used in the Biot-Savart software analysis for the conductor geometry pattern of a novel tapered birdcage resonator, where the most superior end of the coil is dimensionally tapered to optimize the field pattern homogeneity in the XZ and YZ image planes, without sacrificing signal-to-noise performance.
Figure 2C:
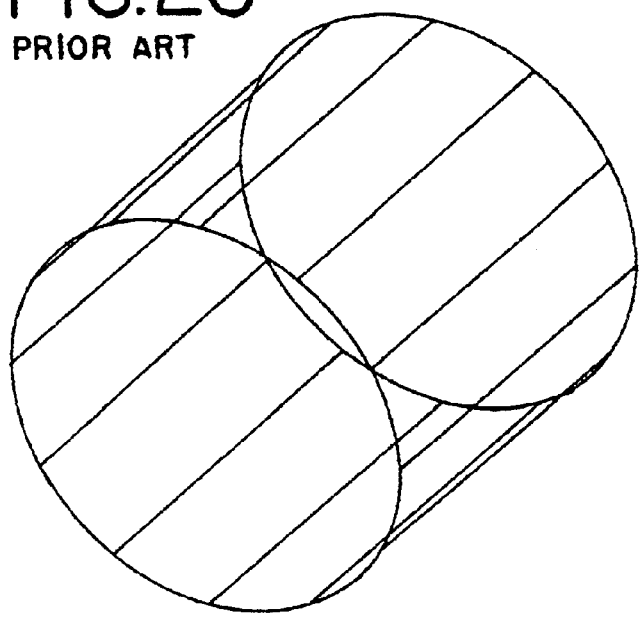
FIG. 2C depicts a wire model for a prior art birdcage resonator, were the wire model may be used in the Biot-Savart software analysis for the conductor geometry pattern of a standard cylindrically shaped birdcage resonator.
Figure 5:
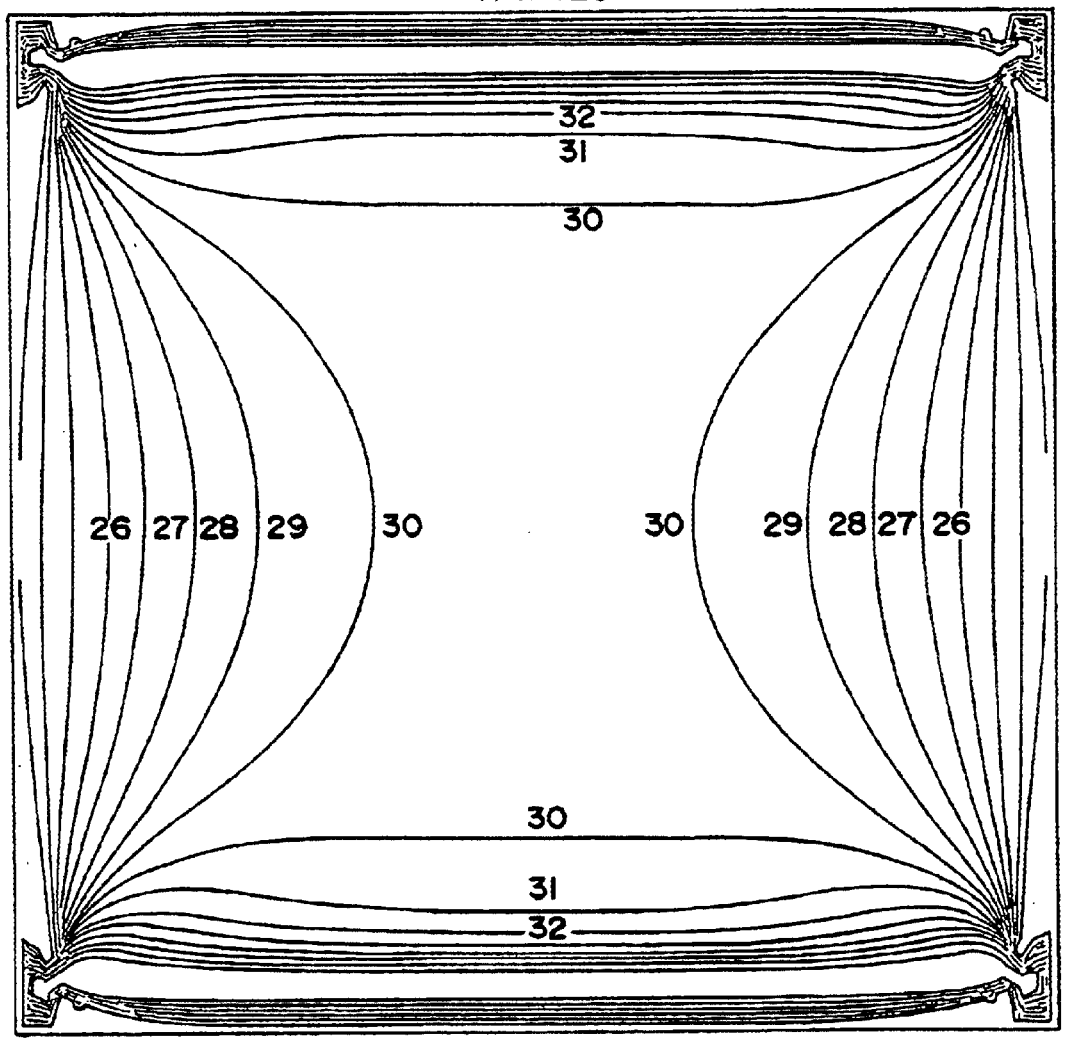
FIG. 5 illustrates a cross sectional plot of the iso-intensity lines of the magnetic flux density (dB) as a function of position with respect to the conductor pattern geometry of the standard cylindrically shaped birdcage resonator illustrated in FIG. 2C.

FIG. 2C depicts a wire model for a prior art birdcage resonator, the conventional cylindrical birdcage resonator. The wire model may be used in a Biot-Savart software analysis to study the magnetic flux density within the coil. FIG. 5 illustrates a cross sectional plot of the iso-intensity lines of the magnetic flux density (dB) as a function of position with respect to the conductor pattern geometry of the standard cylindrically shaped birdcage resonator illustrated in FIG. 2C. The plot shown in FIG. 5 may be generated by applying Biot-Savart's Law to the cylindrical resonator wire model shown in FIG. 2C. Like the plot in FIG. 3, the plot shown in FIG. 5 demonstrates that the iso-intensity lines are well spaced over the middle third of the length of the resonator, but become closely spaced at both ends.

In accordance with preferred embodiments of the present invention, a birdcage coil having improved homogeneity and a method for designing such a coil are provided. In particular, improved homogeneity in comparison with the types of coils shown in FIGS. 2A and 2C is achieved, without sacrificing signal-to-noise ratio. The preferred embodiments are especially useful for higher resolution and/or faster image acquisition time in studies of the human head, for example.

In accordance with a preferred method for designing a birdcage coil, the placement and geometry of the coil conductors is established by iteratively applying a Biot-Savart model to a corresponding wire model of the coil. The Biot-Savart model is used to calculate the magnetic flux density at all spatial locations based on the RF current through the coil conductors and the geometry of the coil structure. The magnetic flux density, B, may be numerically determined based on Biot-Savart's Law, as follows:

$$\bar{B} = \frac{\mu_0}{4\pi} I \int_{-\infty}^{\infty} \frac{d\bar{l} \times (\bar{r} - \bar{a})}{|\bar{r} - \bar{a}|^3}$$

where:
 $\bar{B}$ is the magnetic flux density (T);
 $d\bar{l}$ is an element of conductor in the direction of the current;
 $\bar{a}$ is the position of the conductor; and
 $\bar{r}$ is the spatial position that the magnetic flux density is being computed at.

The Biot-Savart model, which may be implemented in software such as MathCad or Matlab and is well known to those skilled in the art, may be utilized to compute the numeric values of the magnetic flux density values for each spatial position. The values of the magnetic flux density are preferably graphically displayed as iso-intensity lines of the magnetic flux density, B, as a function of position with respect to the coil conductors. In such a plot, a numerical value associated with the iso-intensity lines depicts the relative strength of the magnetic flux density in space, and the lines of iso-intensity depict the homogeneous value of magnetic flux density. This technique provides a visual representation of the expected imaging field pattern for a given coil geometry.

In accordance with a preferred embodiment of the design method, the Biot-Savart model provides a useful tool for modeling the effects of varying the coil conductor geometry to alter the signal-to-noise performance and homogeneity, as further described below. This was the tool used to develop the embodiments of the tapered birdcage coil geometry described herein. Other tools that are capable of determining the magnetic flux density values may alternatively be used.

For a birdcage resonator with N leg conductors, N/2 resonance modes are exhibited, (N/2)−1 are degenerate, and one is non-degenerate. For an arbitrary $n^{th}$ one of the legs, the current distribution for the two quadrature modes follows a cosine current distribution as:

$$I_n = I_0 e^{i\left(\frac{2\pi n}{N}\right)}$$

where $I_0$ is the current in the end ring. The direction of the current depends on its azimuthal direction. The principle mode is selected and has two linear modes orthogonal to one another and provides a homogeneous field at the coil center. These two linear, orthogonal modes are matched to the proper impedance (50 Ω), and either quadrature combined at the output and fed to the system preamplifiers or fed to separate system preamplifiers and receiver channels.

Because both the domed birdcage coil and the cylindrical birdcage coil exhibit less than optimal homogeneity at points located away from the center of the coil, as shown in FIGS. 3 and 5, one would expect that any intermediate design would have similar deficiencies. However, the preferred embodiments provide a tapered birdcage coil having improved homogeneity, particularly and advantageously, toward the superior end of the coil.

A preferred embodiment of a method for designing a coil exhibiting improved homogeneity will now be described. The method makes advantageous use of the Biot-Savart model described above. The method begins with the conventional cylindrical birdcage wire model shown in FIG. 2C. As described above and as shown in FIG. 5, the conventional cylindrical birdcage exhibits good homogeneity over the middle third of the coil, but the magnetic flux density rolls off as one approaches the ends from the center of the coil. By definition, the cylindrical birdcage resonator has two end rings of equal diameter.

In accordance with the preferred embodiment of the design method, a coil with improved homogeneity is designed by iteratively adjusting: 1) the relative sizes of the end rings, and 2) the radius of the taper formed by connecting the leg conductors to the end rings. For each iteration of the leg conductor and end ring geometry, the Biot-Savart model may be used to acquire information about the homogeneity of the magnetic flux density. The conductor and end ring geometry are then adjusted based upon the results of applying the Biot-Savart model until the desired homogeneity is obtained. In this example, it is assumed that the length of the leg conductors is not a variable so that the signal-to-noise performance of the coil is maintained.

Figure 4:
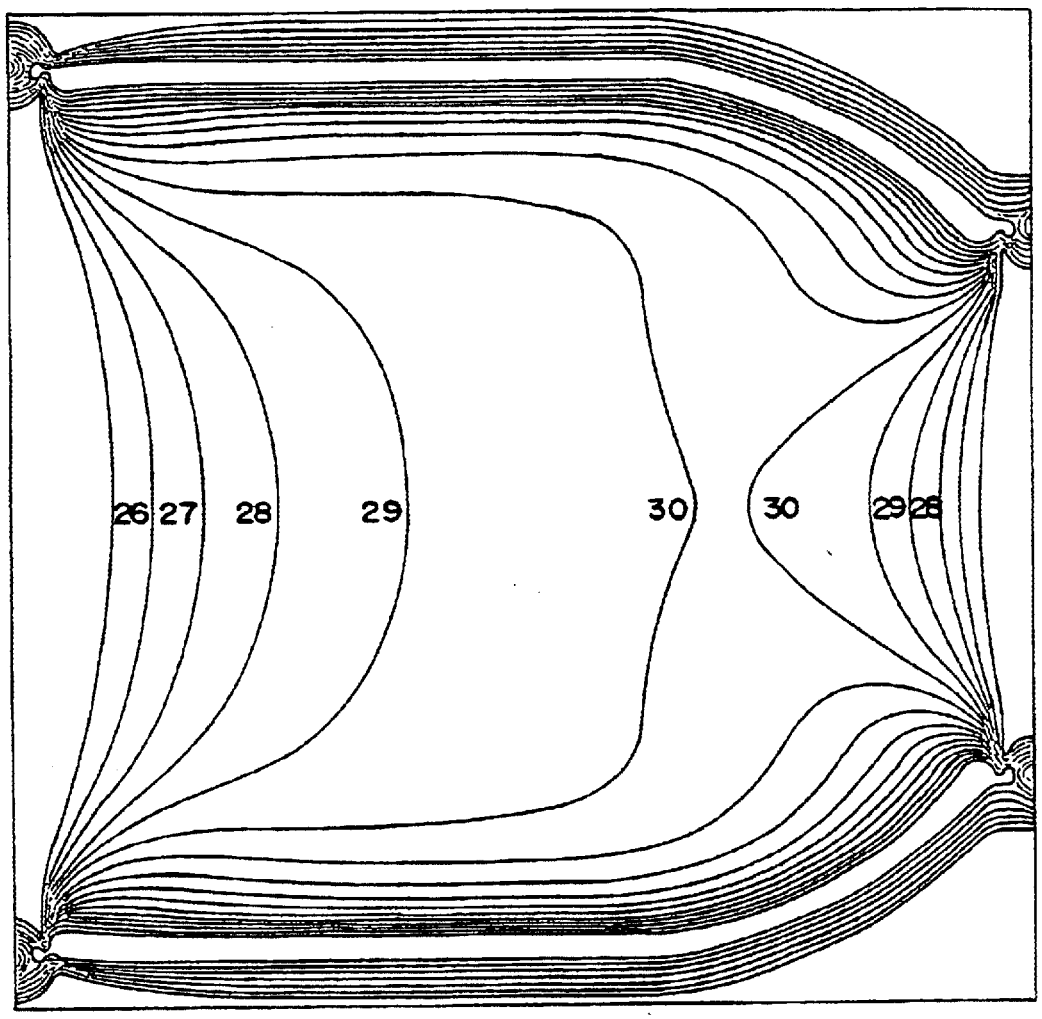
FIG. 4 illustrates a cross sectional plot of the iso-intensity lines of the magnetic flux density (dB) as a function of position with respect to the conductor geometry pattern of the tapered birdcage resonator illustrated in FIG. 2B, where the most superior end of the coil is dimensionally tapered to optimize the field pattern homogeneity in the XZ and YZ image planes, without sacrificing signal-to-noise performance.

Nonetheless, for applications in which the signal-to-noise ratio is less important, the length of the leg conductors may be used as an additional variable in the design process. The wire model shown in FIG. 2B, which has the iso-intensity plot shown in FIG. 4, is a product of this method.

As an alternative to the Biot-Savart modeling tool, experimental verification of the field pattern for a particular coil geometry may be used as an input for the optimization method set forth above. As a further alternative, a combination of experimental verification and Biot-Savart modeling may be used. For example, early iterations may utilize the Biot-Savart model to acquire information about the homogeneity of the magnetic flux density, with later iterations in the process relying upon experimental verification.

Figure 1A:
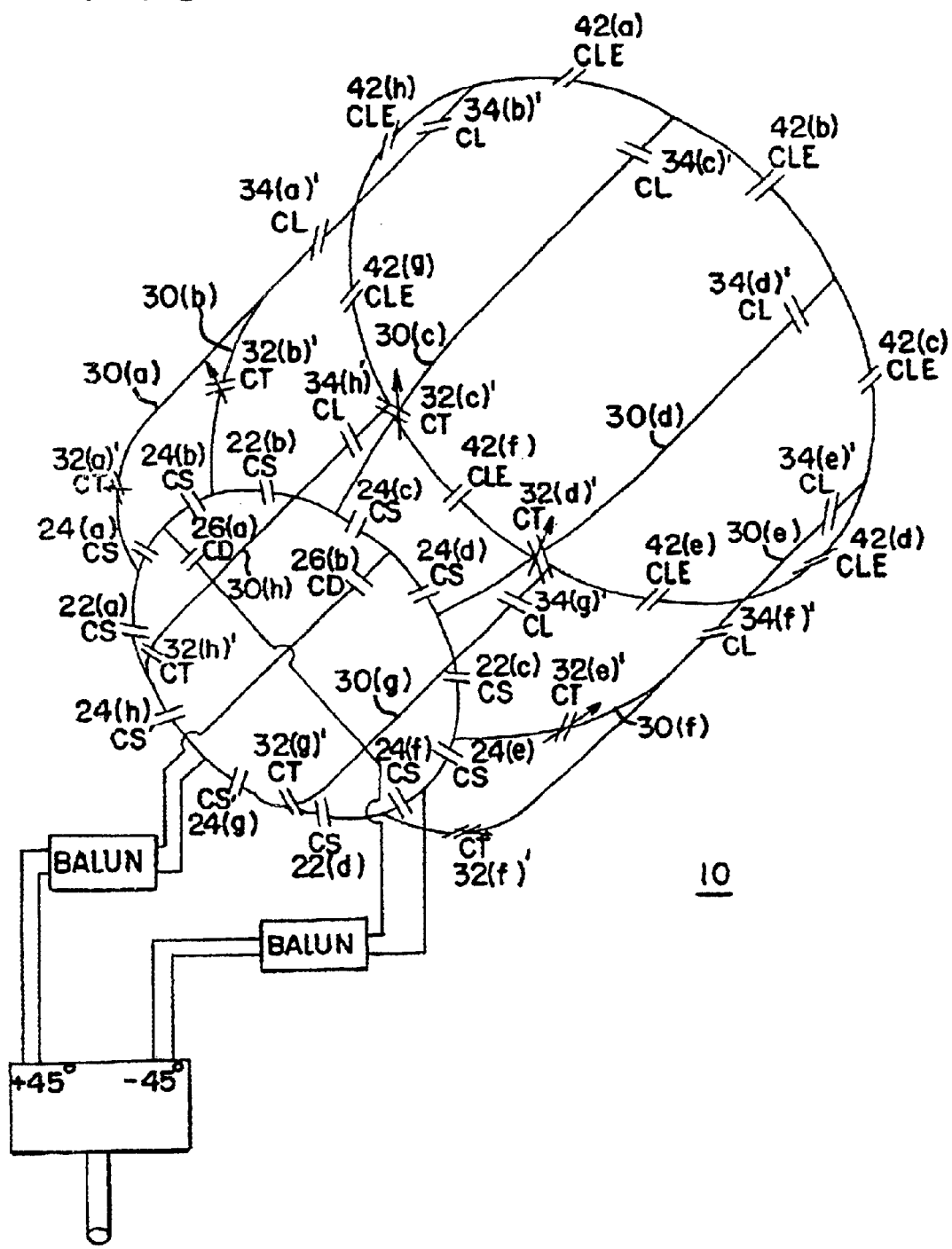
FIG. 1A depicts an electrical schematic of an embodiment of the present invention for an optimized transmit/receive tapered birdcage resonator.

FIGS. 1A and 1B(1)–(3) are electrical schematics for two embodiments of a tapered birdcage resonator in accordance with the present invention. The tapered birdcage resonator embodiment shown in FIGS. 1B(1)–(3) is a "receive only" resonator, i.e., e tapered birdcage resonator does not apply the excitation pulses, but rather the coil is us with an external transmit coil. The coil shown in FIGS. 1B(1)–(3) includes decoupling networks to actively decouple the coil during transmit cycles, which technique is well known to those skilled in the art. As described further below, however, the tapered birdcage resonator may alternatively be a transmit/receive coil, as shown in FIG. 1A.

The tapered birdcage resonator can take form in various configurations of components and component placement. The drawings, which illustrate a band pass configuration, are for purposes of illustrating preferred embodiments and are not to be construed as limiting the invention. In particular, the components alternatively may be selected and placed, in a manner known to those skilled in the art, to create a low pass or high pass configuration of the tapered birdcage resonator.

Referring now to FIGS. 1A and 1B(1)–(3) for the band pass configuration, the capacitors on the small end ring 20 CS 22(*a*)–22(*d*) are selected to achieve proper impedance match using a balanced drive technique over 180 degrees of the end ring 2 for each of the two quadrature modes. The drive points are at virtual ground by splitting the end ring capacitors CS 22(*a*)–22(*d*) into two equal values CS' 24(*a*) –24(*h*) that are double the value of a single end ring capacitor CS 22(*a*)–22(*d*). In a preferred embodiment as shown in FIGS. 1B(1)–(3), the value of CS 22(*a*)–22(*d*) is 110 pF and therefore the value of CS' 24(*a*)–24(*h*) is 220 pF. Capacitance is distributed in the legs 30, CT 32(*a*)–32(*h*) and CL 34(*a*)–34(*h*), to minimize any electric field patient coupling to the coil.

For the embodiment shown in FIGS. 1B(1)–(3), a total desired adjustable range of capacitance in the legs 30 is 34 pF to 49 pF. Therefore, if CL 34(*a*)–34(*h*) is 33 pF then the range of the trim capacitor CT 32(*a*)'32(*h*) in parallel with CL 34(*a*)–34(*h*) would be 1 pF to 16 pF, as shown in FIG. 1B. Tuning of the coil is achieved by varying the capacitance in the legs CT 32(*a*)–32(*h*) of the tapered resonator equally. The capacitors of the large end ring CLE 42(*a*)–42(*h*) are selected to minimize the electric field patient coupling to th coil. In a preferred embodiment, the value of CLE 42(*a*)–42(*h*) is 89 pF. Because the embodiment shown in FIGS. 1B(1)–(3) is a receive-only coil, the diodes D1 and D2 and induct rs provide transmit decoupling.

The drive capacitors CD 26(*a*) & 26(*b*) in FIG. 1A compensate for any inductive length in the balanced drive. Capacitance CD in FIG. 1A is C1/C2/C3 in series with C10 for one mode, and C4/C6/C8 in series with C5 for the other mode. The crossover PCB simply provides the connections to the coil from the feedpoints, A/B and C/D.

Referring again to FIG. 2B, the wire model used in the Biot-Savart analysis for the conductor geometry pattern of a tapered birdcage resonator is shown. The most superior end of the coil 10 is dimensionally tapered to optimize the field pattern homogeneity in the XZ and YZ image planes, without sacrificing signal-to-noise performance. The magnetic flux density within the dome resonator, tapered birdcage, and the cylindrically shaped birdcage resonator shown in FIGS. 2A through 2C were calculated using Biot-Savart's Law. FIGS. 3, 4, and 5 contain the results of the Biot-Savart analysis for the wire models of FIG. 2A, 2B and 2C, respectively.

FIG. 4 illustrates a cross sectional plot of the iso-intensity lines of the magnetic flux density (dB) as a function of position with respect to the conductor geometry pattern of the tapered birdcage resonator shown in FIG. 2B. As shown in FIGS. 2B and 4, the most superior end of the coil is dimensionally tapered to optimize the field pattern homogeneity in the XZ and YZ image planes, without sacrificing signal-to-noise performance. Notably, the iso-intensity plot for the tapered birdcage resonator illustrates improved homogeneity as reflected by the increased spacing between iso-intensity lines, in the region toward the superior end of the resonator, and the large highly uniform region within a single iso-intense band.

Figure 7A:
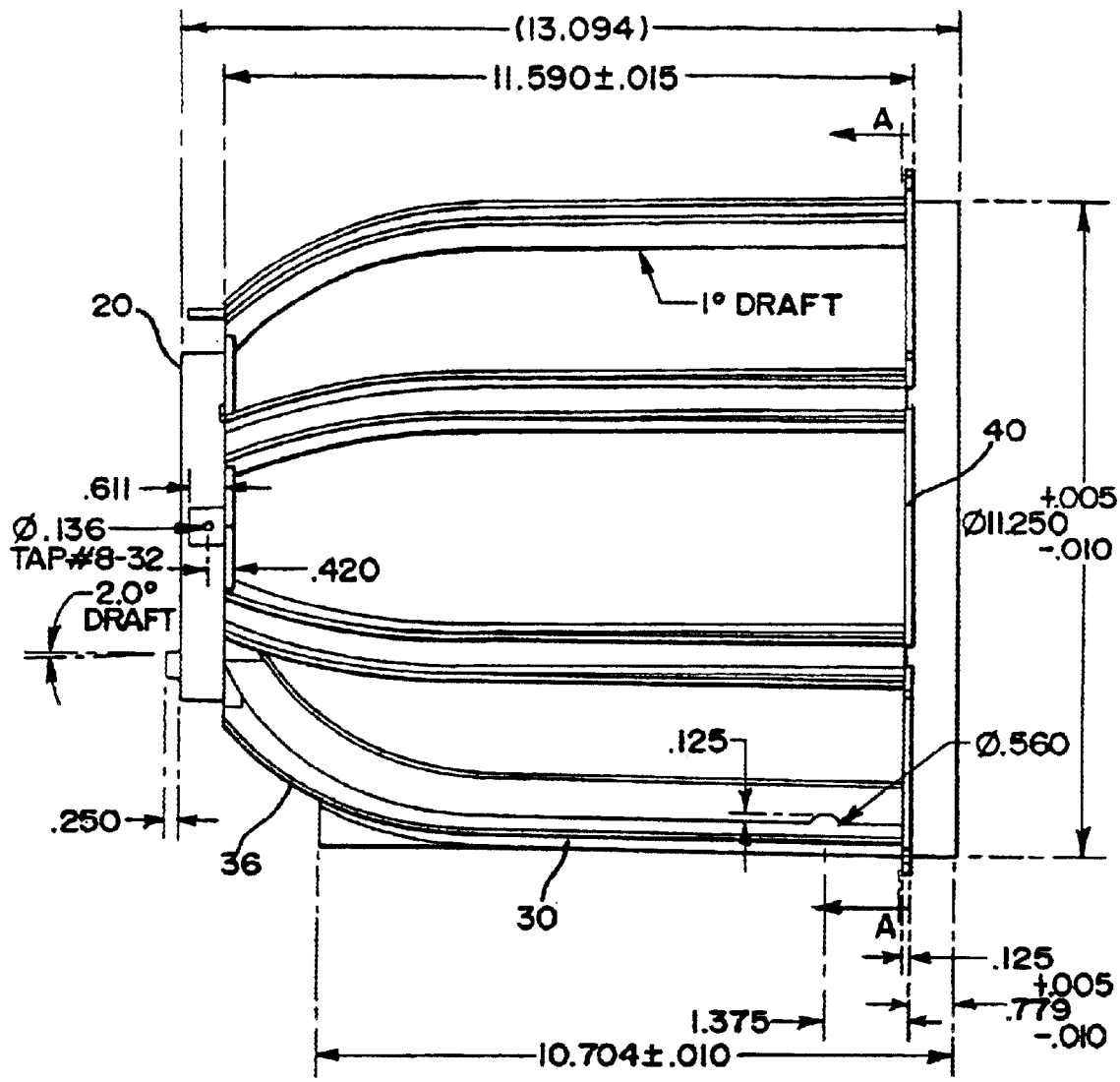
FIGS. 7A through 7C show the structural characteristics, including a radius of the arc used for the legs, of a preferred embodiment of a tapered birdcage resonator.
Figure 7B:
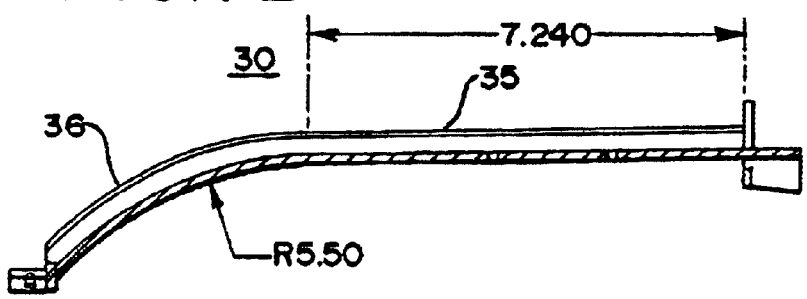
Figure 7C:
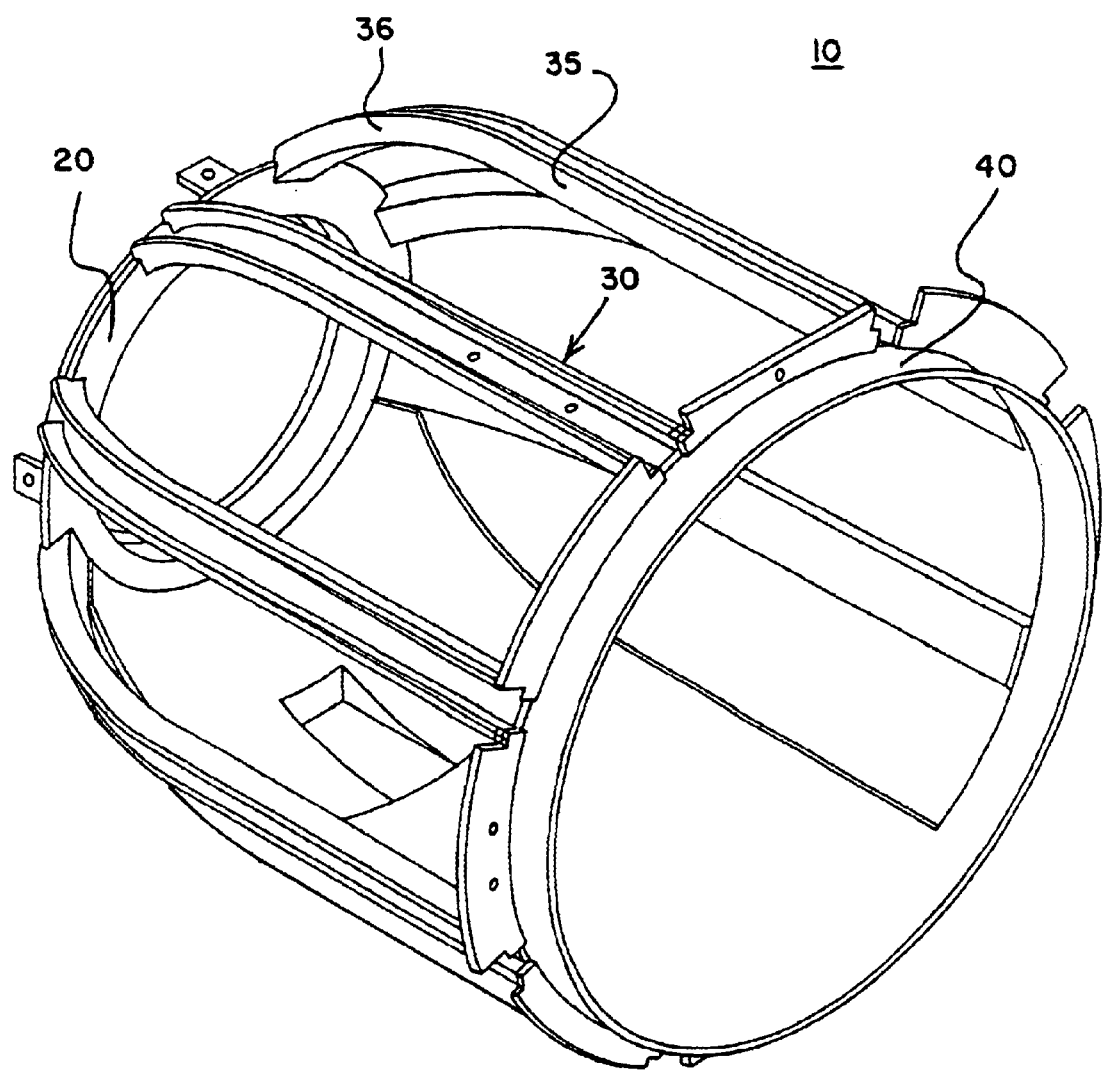

FIGS. 1A and 1B(1)–(3) show electrical schematics for implementing the wire model of FIG. 2B. FIGS. 7A through 7C show the structural characteristics, including a radius of an arc used for the legs, of a preferred embodiment of a tapered birdcage resonator.

FIGS. 7A and 7C show a tapered birdcage resonator having a large end ring 40, a small end ring 20, and a plurality of conductor legs 30. For this embodiment, the large end ring 40 has a diameter of approximately 11.25 inches, the small end ring 20 has a diameter of approximately 5.67 inches, and the leg conductors 30 extend approximately 11.59 inches from the large end ring 40 to the small end ring 20. Thus the ratio of the length of the resonator to the diameter is 11.59 to 11.25, which is approximately 1 to 1.

A detail of a typical leg conductor 30 is also shown in FIG. 7B. The leg conductor 30 includes a linear portion 35 and an arced portion 36, which may also be referred to herein as the tapered portion of the leg conductor 30. For the embodiment shown in FIGS. 7A through 7C, the linear portion 35 is 7.24 inches in length and the radius of the tapered portion is 5.5 inches.

The tapered birdcage resonator shown in FIGS. 7A through 7C may be used for neurovascular or head imaging. The dimensions of this embodiment make it particularly useful for imaging areas of interest within the human head. Other dimensions of the tapered birdcage resonator may alternatively be used for other applications or other regions of interest. This embodiment of the tapered birdcage resonator advantageously exhibits improved homogeneity, particularly toward the superior (small end ring 20) end of the resonator.

Figure 6:
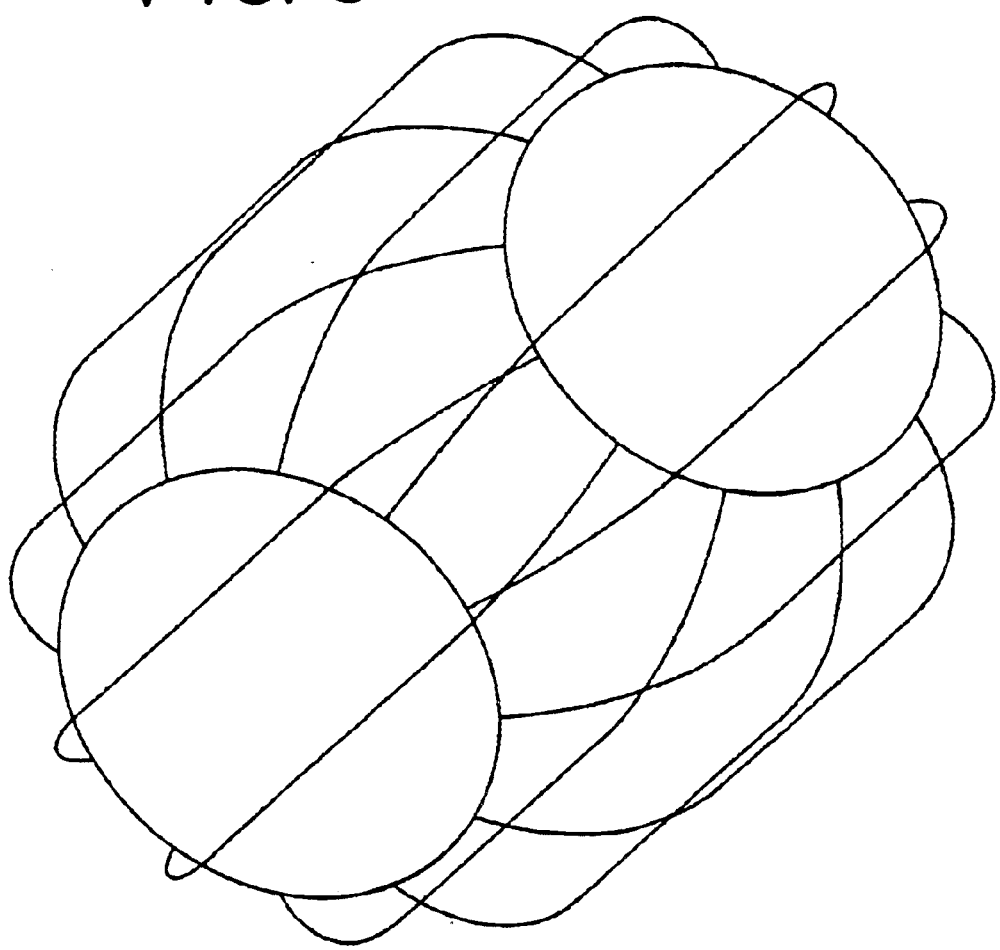
FIG. 6 depicts a wire model of a conductor pattern geometry for a tapered birdcage resonator in which both the superior and inferior ends of the coil are critically tapered.

An alternate embodiment of the invention is illustrated in FIG. 6, which incorporates critically tapering both the most superior and inferior ends of the coil. For this embodiment, the radius of the arc of the taper and the end ring diameter are preferably varied until maximum homogeneity is realized in the field pattern of the coil. This also will result in optimizing the homogeneity throughout the entire length of the coil.

A second alternate embodiment of the invention includes using other geometric conductor patterns to form the arc at the tapered end, such as angled linear segmented sections, eccentrically shaped arc, or any other geometric realization which forms an arc at the tapered end. The desired level of homogeneity may be achieved by calculating the magnetic flux density using a Biot-Savart model. Adjustment to the wire model may be made and a new magnetic flux density calculation may be made. Using this iterative procedure, the desired homogeneity resulting from a variety of geometric shapes for the wire model may be developed.

A third alternate embodiment of the invention includes using end-rings which are tapered larger rather than smaller (relative to the diameter at the center of the resonator) to provide a concentrated magnetic flux density within the region centered within the resonator. The magnetic flux density constriction would be similar to the result realized in solenoid-shaped magnet plasma pinch columns.

A fourth alternate embodiment of the invention includes critically overlapping other resonator structures at the non-tapered, or most inferior, end of the tapered birdcage resonator in a multi-coil phased array arrangement, whereby the tapered birdcage and other resonators form the coil elements of the array. These include birdcage resonators, ladder resonators, loops, Helmholtz pairs, saddle pairs, etc. For example, a four-element array may be constructed by combining two cervical spine coils and an anterior neck coil with the tapered birdcage resonator. Cervical spine coils are described in U.S. Pat. No. 5,196,796, the contents of which are incorporated herein by reference. The anterior neck coil may be an Anterior Neck Coil, as available from Medrad, Inc. of Indianola, Pa., or any equivalent thereto. This arrangement is particularly useful for neurovascular imaging. As a further example, and in accordance with a preferred embodiment, a four-element array may be constructed by combining two cervical spine coils and an anterior neck array coil with the tapered birdcage resonator. For this embodiment, the RF output of the two cervical spine coils may be combined at the RF level and applied to a single receiver, the tapered birdcage may be applied to a receiver, and the anterior neck array may include a superior neck coil and an inferior neck coil, each of which may be applied to a receiver.

A fifth alternate embodiment of the invention includes using a different geometry of the conductor legs to form an elliptical or other shaped resonator structure with respect to the XY imaging plane. The iterative design method described above may be used to determine a critical tapering of one or both the ends of the coil, a radius of the arc of the taper, and an end ring diameter that results in increased homogeneity in the field pattern of the coil.

FIGS. 8A and 8B show a tapered birdcage resonator in accordance with the fifth embodiment. FIG. 8A, which is a view along the z-axis of the coil, shows the conductor geometry pattern in the XY imaging plane. In the XY imaging plane, the resonator has an elliptical shape, with the major diameter of the large end ring being 10.07 inches and the minor diameter of the large end ring being 9.27 inches. The small end ring has major diameter of 5.875 inches and a minor diameter of 5.086 inches. As shown in FIG. 8, the radius of the taper towards the small end ring is 4.635 inches, and the radius begins 3.75 inches from the large end ring.

Like the tapered birdcage resonator shown in FIGS. 7A through 7C, the tapered birdcage resonator shown in FIGS. 8A and 8B preferably has eight leg conductors. More or fewer leg conductors may alternatively be used.

In comparison with the embodiment shown in FIGS. 7A through 7C, it should be observed that the embodiment shown in FIGS. 8A and 8B will, generally speaking, locate the leg conductors closer to the region of interest, such as the human head. It should also be noted that the length to diameter ratio for the embodiment shown in FIGS. 8A and 8B is actually less than 1 to 1. The reduced coil volume provides improved signal-to-noise performance in comparison to known resonators such as the cylindrical birdcage and the domed birdcage. Although the embodiment shown in FIGS. 8A and 8B is preferably used to obtain high resolution images of the human brain, it may be used for other applications as well.

FIG. 9 is an electrical schematic for the embodiment of the tapered resonator shown in FIGS. 8A and 8B, in which the tapered resonator is a band pass, high-resolution brain coil driven in quadrature mode. The rod and end ring capacitors are selected to ensure that the resonant frequencies of the two modes of the coil remain identical, and the electrical isolation betwixt the two quadrature modes of the coil remains high despite the distortions to the physical structure symmetry caused by the non-circular cross section. The capacitors CT $132(b)$, $(d)$–$(h)$ and CL $134(b)$, $(d)$–$(h)$ on legs $130$ $(b)$, $(d)$–$(h)$ are selected to achieve a proper impedance match using a balanced drive technique over 180 degrees for each of the two quadrature modes. The in-phase (I) drive point is at leg $130(a)$ through capacitors $136(a)$, CD $137(a)$, and $138(a)$. The out-of-phase (Q) drive point is at leg $130(c)$ through capacitors $136(c)$, and $138(c)$. Capacitance is distributed in the legs $130(b)$, $(d)$–$(h)$, through CT $132(b)$, $(d)$–$(h)$ and CL $134(b)$, $(d)$–$(h)$ to minimize any electric field patient coupling to the coil.

Although capacitors CT $132(b)$, $(d)$–$(h)$ and CL $134(b)$, $(d)$–$(h)$ are shown in parallel in FIG. 9, they may alternatively be in series provided the appropriate values for the capacitors are chosen. Tuning of the coil is achieved by varying the capacitance in the legs CT $132(b)$, $(d)$–$(h)$ of the tapered resonator.

In a preferred embodiment as shown in FIG. 9, the value of CS $122(a)$–$122(h)$ on the small end ring is 820 pF. Capacitors $136(a)$, $(c)$, and $138(a)$, $(c)$ are 47 pF. The drive capacitor CD $137(a)$, 8.2 pF, is used to compensate for any inductive length in the balanced drive. The capacitors of the large end ring CLE $142(a)$–$142(h)$ are selected to minimize the electric field patient coupling to the coil. In a preferred embodiment, the value of CLE $142(a)$–$142(h)$ is 190 pF.

A sixth alternate embodiment of the invention includes an electrical implementation of the tapered birdcage resonator using various configurations of components and component placement. This will create a low pass, band pass or high pass configuration of the tapered birdcage resonator. For example, the placement of the components may be changed, or even the use of other reactive components such as inductors may be used to practice the invention.

A seventh alternate embodiment of the invention includes electrically driving the tapered birdcage resonator either linearly, in quadrature, or in phased array mode at either of the tapered or non-tapered end rings, or electrically driving the resonator on any of the legs of the resonator. For example, the tapered birdcage coil may be a quadrature, transmit/receive, eight rod, quasi-bandpass tapered birdcage resonator. The advantage of this configuration is that the coil has a smaller diameter and reduced length to bring the enclosed volume to a practical minimum. This configuration may be made using a quadrature hybrid that interfaces this coil element as a conventional transmit/receive device operating in a quadrature similar to the GEMS Signa Quadrature Head Coil.

To operate the coil as a linear coil, the coil will have a single RF output for connection to the MRI system. The current distribution in the rods, or conductor legs of the coil, is sinusoidal, with the current opposite the drive point in the reverse direction (equal magnitude) and the current in the rods at +90° and −90° equal to zero. If, on the other hand, the coil is to operate in the quadrature mode, a second drive point, rotated by 90° from the first, is added (see FIG. 1A). The second drive point is at the zero current point for the first linear mode of the coil. The first drive point is at the zero current point for the second drive linear mode of the coil. Linear and quadrature operation of MRI coils are topics that are well known to those skilled in the art. Either capacitive or inductive coupling may be used.

Another possible configuration is to use the tapered birdcage in the phased array mode as a transmit/receive coil. A proper phased array cable is required to apply power to two outputs only in quadrature, and to receive on two receivers. The transmit mode operates the coil element as a conventional quadrature birdcage. The two quadrature outputs drive two Phased Array ports.

The coil may have two distinct operating modes: one for highest image quality, and one for rapid [single receiver] acquisitions. For the highest image quality, the basic coil will operate as a two element phased array receiver coil where the two channels are derived from the two quadrature outputs from the tapered birdcage element. The transmit mode operation will be accomplished by applying power to the same tapered birdcage element. When single receiver operation is desired for rapid acquisitions, the two coil quadrature modes will be combined prior to being input to the MRI system, and directed to a receiver input. Selection of the two modes may be made by the designation of the coil name, and the resulting Port Enable Mask designated by a configuration file run on the MRI system.

In order to increase the uniformity and superior-to-inferior coverage of the transmit field from the tapered birdcage element, a spatially selective loading device may be used to attenuate only the transmit field in a spatially appropriate manner. This will reduce the RF magnetic field intensity $B_1$ in a pattern that will endeavor to compensate for the increased efficiency of the coil element in the central and superior regions of the coil. The field absorption device will be active only during the transmit mode operation of the coil. Therefore, it will not have any negative effect upon the receive mode RF magnetic field sensitivity of the coil.

Alternatively, the coil can be used in a single receiver mode only. However, this prevents the coil from potentially benefiting from the phased array technology. The advantages of phased array include the ability to equally load the two quadrature modes of the coil via the preamplifier decoupling concept, as described by P. Roemer, "The NMR Phased Array," Journal of Magnetic Resonance (November 1990), and to utilize the phase insensitive combining technique employed by the GE Signa system for phased array acquisitions. As described above, the tapered birdcage coil may also be set up as a receive-only coil. However, the receive-only coil may encourage the generation of Annefact type artifacts, and potentially extend scan times due to the need for the No Phase Wrap option. Additionally, the use of decoupling networks on the coil for receive-only operation will lower the available signal-to-noise ratio performance due to the inherent losses in the needed RF switching diodes.

Unlike prior coil designs that resulted in a coil that is too long for optimum signal-to-noise ratio or that resulted in a virtual ground convergent point causing field inhomogeneity, the preferred embodiments provide improved homogeneity in the XZ and YZ image planes while maintaining an optimum signal-to-noise ratio.

In view of the wide variety of embodiments to which the principles of the present invention can be applied, it should be understood that the illustrated embodiments are exemplary only, and should not be taken as limiting the scope of the present invention. For example, the steps of the design method may be taken in sequences other than those described, and more or fewer elements may be used than are described. In addition, although reference is made herein to the GEMS Signa MRI system, other systems having similar capabilities may alternatively be used to receive and process signals from the coils described above.

We claim:

1. A coil for use with a magnetic resonance imaging (MRI) system to form images of a region of a patient during an MRI scanning procedure, said coil comprising:
   (a) a first ring at one end of said coil, said first ring being electrically conductive and having a first diameter;
   (b) a second ring at an other end of said coil, said second ring being electrically conductive and having a second diameter different from said first diameter of said first ring; and
   (c) a plurality of rods electrically interconnecting said first and said second rings to form said coil therewith, each of said rods having a linear portion and a tapered portion with said linear portion being connected to said first ring and said tapered portion being connected to said second ring, said tapered portions of said rods configured to provide said coil with a substantially homogeneous pattern of magnetic flux density in at least one of an XZ imaging plane and a YZ imaging plane of said coil.

2. The coil claimed in claim 1, wherein said coil is a birdcage coil.

3. The coil claimed in claim 1, wherein said second diameter of said second ring is smaller than said first diameter of said first ring.

4. The coil claimed in claim 1 wherein said tapered portion of each of said rods comprises at least one angled linear segmented section.

5. The coil claimed in claim 1 wherein said first ring and said second ring are each larger in diameter than a center of said coil to thereby enable a concentration of said magnetic flux density to be produced at a region centered within said coil.

6. The coil claimed in claim 1, further comprising at least one additional coil at least partially overlapping said coil at an inferior end thereof to form therewith, and for operation as, a phased array.

7. The coil claimed in claim 1, wherein said first and said second rings are circular.

8. The coil claimed in claim 1 wherein said first and said second rings are elliptical with said first diameter being a major diameter of said first ring and said second diameter being a major diameter of said second ring.

9. The coil claimed in claim 1 wherein said coil is a receive-only coil.

10. The coil claimed in claim 1 wherein said coil is a transmit/receive coil.

11. The coil claimed in claim 1 wherein each of said rods and said first and said second rings contain therein a plurality of reactive electrical components.

12. The coil claimed in claim 1 wherein said coil is configured as one of a low pass coil, a high pass coil and a band pass coil.

13. The coil claimed in claim 1 wherein said coil is operable in one of a linear mode and a quadrature mode.

14. A coil for use with a magnetic resonance imaging (MRI) system to form images of a region of a patient during an MRI scanning procedure, said coil comprising:

(a) a first ring at one end of said coil, said first ring being electrically conductive and having a first diameter;

(b) a second ring at an other end of said coil, said second ring being electrically conductive and having a second diameter; and (c) a plurality of rods electrically interconnecting said first and said second rings to form said coil therewith, each of said rods having a linear portion and at each end thereof a tapered portion to which said first and said second rings respectively connect, said tapered portions being selected to provide said coil with a substantially homogeneous pattern of magnetic flux density in at least one of an XZ imaging plane and a YZ imaging plane of said coil.

15. The coil claimed in claim 14 wherein said first and said second diameters of said first and said second rings, respectively, are equal.

16. The coil claimed in claim 14 wherein said first and said second diameters are each larger than a diameter at a center of said coil such that said tapered portions of said rods are tapered outwardly.

17. The coil claimed in claim 14 wherein said first and said second diameters are each smaller than a diameter at a center of said coil such that said tapered portions of said rods are tapered inwardly.

18. The coil claimed in claim 14 wherein said coil is a birdcage coil.

19. A coil for use with a magnetic resonance (MR) system, said coil comprising:

(a) a plurality of conductors arranged to form a first opening at one end having a first diameter and a second opening at an other end having second diameter different from said first diameter; and (b) at least some of said conductors each having a linear portion a tapered portion, with said tapered portions of said conductors providing said coil with a substantially homogeneous pattern of magnetic flux density in at least one of an XZ imaging plane and a YZ imaging plane of said coil.

20. The coil claimed in claim 19 wherein said coil is a birdcage coil.

21. The coil claimed in claim 19 wherein said second diameter of said second opening is smaller than said first diameter of said first opening.

22. The coil claimed in claim 19 wherein said tapered portion of each of said at least some of said conductors comprises at least one angled linear segmented section.

23. The coil claimed in claim 19 wherein said plurality of conductors includes a first conductive ring defining said first opening and a second conductive ring defining said second opening, with said linear and said tapered portions of each of said at least some of said conductors being serially connected and thus electrically interconnecting said first and said second conductive rings.

24. The coil claimed in claim 19 wherein said first opening is adapted for accommodating insertion of a head of a patient into said coil.

25. The coil claimed in claim 19 wherein said conductors of said coil are supported by a housing therefor.

26. The coil claimed in claim 19 wherein said first and said second openings are circular.

27. The coil claimed in claim 19 wherein said first and said second openings are elliptical with said first diameter being a major diameter of said first opening and said second diameter being a major diameter of said second opening.

28. The coil claimed in claim 19 wherein said coil is a receive-only coil.

29. The coil claimed in claim 19 where said coil is a transmit/receive coil.

30. The coil claimed in claim 19 wherein said conductors contain therein a plurality of reactive electrical components.

31. The coil claimed in claim 19 wherein said coil is configured as one of a low pass coil, a high pass coil and a band pass coil.

32. The coil claimed in claim 19 wherein said coil is operable in one of a linear mode and a quadrature mode.

33. A coil for use with a magnetic resonance (MR) system, said coil comprising:

(a) a first end defining a first opening having a first diameter;

(b) a second end defining a second opening having a second diameter different from said first diameter; and (c) a plurality of conductive rods extending between said first and said second ends, each of said conductive rods having a linear portion and a tapered portion with said linear portion extending from said first end and said tapered portion extending from said second end, said tapered portions of said conductive rods providing said coil with a substantially homogeneous pattern of magnetic flux density in at least one of an XZ imaging plane and a YZ imaging plane of said coil.

34. The coil claimed in claim 33 wherein said coil is a birdcage coil.

35. The coil claimed in claim 33 wherein said second diameter of said second end is smaller than said first diameter of said first end.

36. The coil claimed in claim 33 wherein said tapered portion of each of said conductive rods comprises at least one angled linear segmented section.

37. The coil claimed in claim 33 wherein said first end includes a first conductive ring and said second end includes a second conductive ring, with said conductive rods electrically interconnecting said first and said second conductive rings.

38. The coil claimed in claim 37 wherein said first conductive ring and said second conductive ring are each larger in diameter than a center of said coil to thereby enable a concentration of said magnetic flux density to be produced at a region centered within said coil.

39. The coil claimed in claim 33 further comprising at least one additional coil at least partially overlapping said coil at an inferior end thereof to form therewith, and for operation as, a phased array.

40. The coil claimed in claim 33 wherein said first and said second ends are circular.

41. The coil claimed in claim 33 wherein said first and said second ends are elliptical with said first diameter being a major diameter of said first end and said second diameter being a major diameter of said second end.

42. The coil claimed in claim 33 wherein said coil is a receive-only coil.

43. The coil claimed in claim 33 where said coil is a transmit/receive coil.

44. The coil claimed in claim 37 wherein each of said conductive rods and said first and said second conductive rings contain therein a plurality of reactive electrical components.

45. The coil claimed in claim 33 wherein said coil is configured as one of a low pass coil, a high pass coil and a band pass coil.

46. The coil claimed in claim 33 wherein said coil is operable in one of a linear mode and a quadrature mode.

47. A coil for use with a magnetic resonance (MR) system, said coil comprising:

(a) a first end defining a first opening having a first diameter;

(b) a second end defining a second opening having a second diameter; and (c) a plurality of conductive rods extending between said first and said second ends, each of said conductive rods having a linear portion and at each end thereof a tapered portion, said tapered portions being selected to provide said coil with a subsantially homogeneous pattern of magnetic flux density in at least one of an XZ imaging plane and a YZ imaging plane of said coil.

48. The coil claimed in claim 47 wherein said first and said second diameters of said first and said second ends, respectively, are equal.

49. The coil claimed in claim 47 wherein said first and said second diameters are each larger than a diameter at a center of said coil such that said tapered portions of said conductive rods are tapered outwardly.

50. The coil claimed in claim 47 wherein said first and said second diameters are each smaller than a diameter at a center of said coil such that said tapered portions of said conductive rods are tapered inwardly.

51. The coil claimed in claim 47 wherein said coil is a birdcage coil.

* * * * *